United States Patent [19]

Jolly

[11] 4,365,588

[45] Dec. 28, 1982

[54] FIXTURE FOR VPE REACTOR

[75] Inventor: Stuart T. Jolly, Yardley, Pa.

[73] Assignee: RCA Corporation, New York, N.Y.

[21] Appl. No.: 243,442

[22] Filed: Mar. 13, 1981

[51] Int. Cl.³ ............................................. C23C 11/00
[52] U.S. Cl. .................................... 118/732; 118/500; 118/729; 156/611
[58] Field of Search ............... 118/732, 728, 729, 500, 118/715, 725, 720, 721; 156/610, 611

[56] References Cited

U.S. PATENT DOCUMENTS

| | | | |
|---|---|---|---|
| 3,316,130 | 4/1967 | Dash et al. | 148/175 |
| 3,394,390 | 7/1968 | Cheney | 118/725 X |
| 3,603,284 | 9/1971 | Garnache | 118/730 X |
| 3,617,371 | 11/1971 | Burmeister, Jr. | 118/725 X |
| 3,701,682 | 7/1972 | Gartman et al. | 117/201 |
| 3,901,746 | 8/1975 | Boucher | 148/175 |
| 4,129,090 | 12/1978 | Inahiwa et al. | 118/728 |
| 4,256,053 | 3/1981 | Dozier | 118/728 |

*Primary Examiner*—John D. Smith
*Assistant Examiner*—Bernard F. Plantz
*Attorney, Agent, or Firm*—Birgit E. Morris; Donald S. Cohen; Kenneth R. Glick

[57] ABSTRACT

A fixture for use within an epitaxial deposition reactor includes a box adapted to receive a semiconductor substrate. The box is movable to a position of reactant gas flow within the reactor and it includes a porous cover. A stagnant mixture of reactant gases is maintained between the substrate and the cover while the box is within the zone of reactant gas flow.

7 Claims, 2 Drawing Figures

FIXTURE FOR VPE REACTOR

The U.S. Government has rights in this invention pursuant to Contract No. 79-6352.

BACKGROUND OF THE INVENTION

The present invention relates to fixturing for use in a vapor phase epitaxy (VPE) reactor. More particularly, it relates to a substrate holding fixture which can be used in a conventional deposition reactor.

High quality monocrystalline semiconductor films having high purity and few crystalline defects are commonly formed by epitaxial deposition. The depositon can be performed from the vapor phase and the resulting film might comprise a single element such as silicon or a compound semiconductor such as GaAs. Vapor phase deposition is typically performed by placing a single crystalline semiconductor substrate in a reactor at an elevated temperature and introducing a reactant gas or gases to the reactor. For example, to deposit an epitaxial layer of GaAs on a GaAs substrate, the reactant gases typically contain GaCl and arsenic vapor and the substrate is heated to about 700° C. Additionally, controlled amounts of conductivity modifying impurities may be introduced during the deposition so as to form a controlled level of N or P type doping in the epitaxial film. In the cited example, selenium in the form of hydrogen selenide might be introduced to form an N type film, and zinc in the form of dimethyl zinc might be introduced to form a P type film.

To achieve a quality epitaxial film, both the thickness and the purity of the epitaxial layer must be controlled. Conventional techniques for controlling epitaxial deposition are disclosed in U.S. Pat. No. 3,701,62, THIN FILM DEPOSITION SYSTEM, issued Oct. 31, 1972 to W. W. Gartman et al., and U.S. Pat. No. 3,316,130, EPITAXIAL GROWTH OF SEMICONDUCTOR DEVICES, issued Apr. 25, 1967 to W. C. Dash et al. The present invention provides a means for generating a high purity film having minimal particulate contamination. The invention also provides a means for generating a film of uniform thickness without being limited to the use of a specific reactor configuration.

SUMMARY OF THE INVENTION

A fixture for use within an epitaxial deposition reactor is provided. The fixture includes a box into which a substrate can be placed, the box being movable to a position of reactant gas flow within the depositin reactor. The box is provided with a porous cover such that a stagnant mixture of reactant gases can be maintained between the substrate and the cover while the box is within the zone of reactant gas flow.

DETAILED DESCRIPTION

Figure 1:
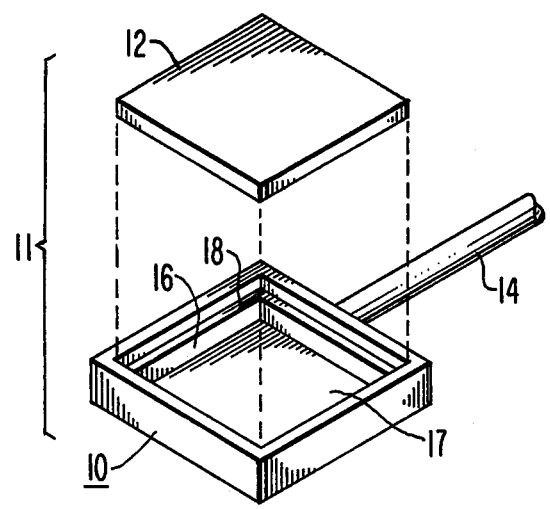
FIG. 1 is a perspective view of the fixture of the present invention.

The preferred embodiment of a fixture 11 of the present invention, illustrated in FIG. 1, incorporates a box 10 having a porous cover 12. A rod 14 extends from a wall 16 of the box 10 and serves as a handle for positioning the box 10 within a deposition reactor. The box 10 is dimensioned so as to accommodate a semiconductor substrate (not shown) and may be of any suitable shape. In the illustrated embodiment the box defines a rectangular cavity 17 and its walls 16 incorporate a ledge 18 for supporting the cover 12. The box, cover and handle should be fabricated from a material which remains inert in the epitaxial deposition environment. For example, the box 10 and handle 14 can conveniently be fabricated from fused quartz, and the cover 12 can be fabricated from a sintered quartz filter plate. It is important that the cover 12 be porous in structure so as to permit transfer of material through its thickness. Suitable sintered quartz filter material can be obtained from Thermal American Fused Quartz Company, Montville, N.J. The thickness of the cover 12 might be approximately 0.1 inches (2.5 mm), the box might typically be approximately 1 inch square, and the cavity might have a height of 0.040 inches (1 mm).

Figure 2:
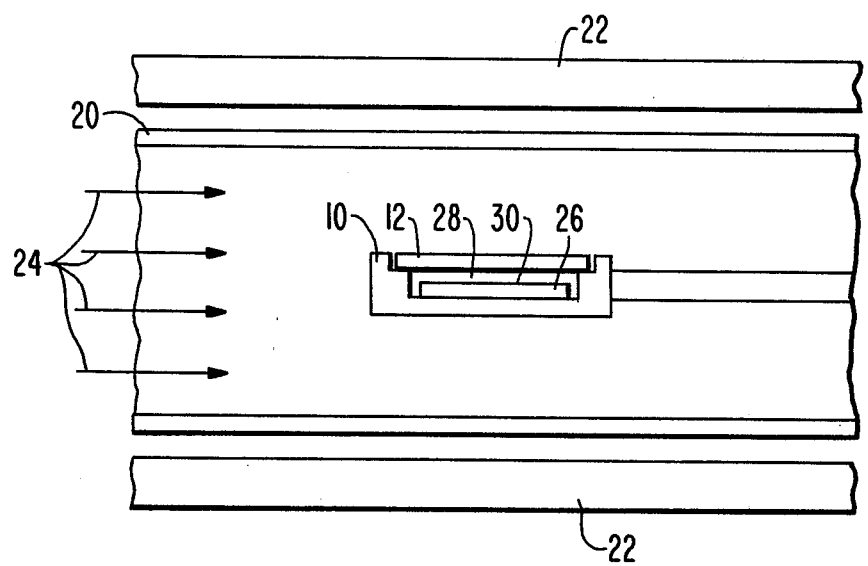
FIG. 2 is a sectional view of the fixture of the present invention within a conventional deposition reactor.

The fixture 11 of the present invention is suitable for use in a variety of deposition reactors. The fixture 11 is not an integral part of the reactor, and its use is not limited to any particular reactor configuration. The sectional view of FIG. 2 illustrates the fixture within the deposition zone of a conventional tube reactor 20. An appropriate substrate such as a GaAs wafer is disposed in the box 10 and the cover 12 is positioned so as to seal the box 10. The spacing between the substrate 26 and the cover 12 might be approximately between 0.005-0.020 inches (0.13-0.5 mm). In the deposition zone, the reactor 20 is surrounded by a heat source such as a furnace 22. During deposition, the fixture 11 is positioned within the deposition zone and reactant gases, represented by the arrows 24, are introduced to the deposition zone. To deposit a GaAs epitaxial layer, the reactant gases will typically contain GaCl and arsenic vapor.

In conventional deposition reactors the substrate is supported by a fixture which directly exposes the substrate to the reactant gases. For example, the substrate might merely be placed onto a pallet or bracket so as to hold the substrate at some desired orientation with respect to the reactant gas flow 24. However, in conventional deposition reactors, the reactant gases are in motion within the deposition zone, creating turbulence at the exposed substrate surface where the deposition is to take place. It has been observed that this turbulence creates nonuniformity in the thickness of the epitaxial layer and can make the impurity concentration of the epitaxial layer difficult to control.

By comparison, the fixture of the present invention creates a stagnant zone 28 within the box 10 between the cover 12 and exposed surface 30 of the substrate 26. The reactant gases diffuse through the porous cover 12 into the stagnant zone 28 such that the mixture of gas within the stagnant zone is substantially the same as the mixture which surrounds the fixture. Epitaxial deposition onto the substrate surface 30 occurs from the mixture within the stagnant zone, creating a layer of uniform thickness. The deposition rate has been observed to be substantially similar to what it would be using conventional fixturing.

Additionally, the illustrated configuration permits one to rapidly change the composition of the gas mixture without detrimentally affecting the layer being epitaxially formed. For example, if one wishes to change the concentration of N or P type impurity or if one wishes to deposit a second semiconductor layer, the reactant gas flow 24 can rapidly be changed to a new mixture. The zone 28 will remain substantially stagnant despite the turbulence of the flow 24 surrounding the fixture. Thus, for example, a sharp transition N/N+ layer or a sharp transition GaAs/GaInP layer might be controllably formed using the present invention.

Still another advantage of the present invention is the reduced particulate contamination that occurs in the epitaxial film. Although the internal portions of conventional deposition reactors are often rigorously cleaned between depositions, there frequently remains some degree of particulate contamination which can detrimentally affect an epitaxial deposition. Since the substrate 26 is contained within a sealed box throughout the deposition sequence there is no opportunity for substrate or epitaxial film contamination due to extraneous materials which might be present within the reactor tube.

Although the present invention has been described in terms of a substantially rectangular fused quartz box having a porous quartz lid, it should be recognized that deviations in shape and material can be made departing from the scope of the invention. For example, the box need not be made from quartz and other porous materials might be substituted for the sintered filter plate cover 12.

What is claimed is:

1. A fixture for use within an epitaxial deposition reactor, comprising:
    a box adapted to receive a semiconductor substrate, the box being movable to a position of turbulent reactant gas flow within the reactor; and
    a porous cover for said box, said cover permitting reactant gas to diffuse therethrough, such that a stagnant mixture of reactant gas is maintained between the substrate and the cover while the box is within the zone of turbulent reactant gas flow.

2. A fixture in accordance with claim 1, wherein the cover is sintered quartz filter plate.

3. A fixture in accordance with claim 1, wherein the spacing between the cover and the substrate ranges approximately between 0.005–0.20 inches.

4. A fixture in accordance with claim 1, wherein the box is attached to a rod.

5. An epitaxial deposition system, comprising:
    a reactor having a deposition zone of turbulent reactant gas flow;
    a box adapted to receive a semiconductor substrate, the box being movable to a position within the deposition zone; and
    a porous cover for said box, said cover permitting reactant gas to diffuse therethrough, such that a stagnant mixture of reactant gas is maintained between the substrate and the cover while the box is within the deposition zone.

6. A system in accordance with claim 5, wherein: the deposition zone contains flowing reactant gas.

7. A system in accordance with claim 5, wherein the reactor is tube-shaped.

* * * * *